United States Patent [19]

Mulder et al.

[11] Patent Number: 4,940,909
[45] Date of Patent: Jul. 10, 1990

[54] CONFIGURATION CONTROL CIRCUIT FOR PROGRAMMABLE LOGIC DEVICES

[75] Inventors: Theodor Mulder, Pleasanton; Cecil H. Kaplinsky, Palo Alto, both of Calif.

[73] Assignee: Plus Logic, Inc., San Jose, Calif.

[21] Appl. No.: 351,485

[22] Filed: May 12, 1989

[51] Int. Cl.$^5$ .......................................... H03K 19/177
[52] U.S. Cl. .................................. 307/465; 307/202.1; 307/468; 307/272.2; 307/272.3; 365/189.08; 377/64
[58] Field of Search ............... 307/202.1, 465-469, 307/480, 494, 272.1-272.3, 243; 365/189.08, 189.12, 154; 377/64, 70, 75-76

[56] References Cited

U.S. PATENT DOCUMENTS

| | | | |
|---|---|---|---|
| 4,366,393 | 12/1982 | Kasuya | 307/465 |
| 4,458,163 | 7/1984 | Wheeler et al. | 307/466 |
| 4,524,430 | 6/1985 | Page | 365/189.08 X |
| 4,536,881 | 8/1985 | Kasuya et al. | 377/70 |
| 4,661,922 | 4/1987 | Thierbach | 365/189.08 X |
| 4,703,206 | 10/1987 | Cavlan | 307/465 |
| 4,706,216 | 11/1987 | Carter | 365/94 |
| 4,706,217 | 11/1987 | Shimizu et al. | 365/154 |
| 4,713,792 | 12/1987 | Hartmann et al. | 364/900 |
| 4,721,868 | 1/1988 | Cornell et al. | 307/465 |
| 4,730,130 | 3/1988 | Baskett | 307/466 |
| 4,761,768 | 8/1988 | Turner et al. | 307/468 X |
| 4,763,020 | 8/1988 | Takata et al. | 377/75 X |
| 4,780,628 | 10/1988 | Illman | 307/465 |
| 4,783,606 | 11/1988 | Goetting | 307/465 |
| 4,791,603 | 12/1988 | Henry | 307/465 X |
| 4,866,309 | 9/1989 | Banke et al. | 307/468 X |

FOREIGN PATENT DOCUMENTS 0021652 2/1980 Japan ................. 307/465

OTHER PUBLICATIONS

Michael J. Allen, "A 6 ns CMOS EPLD with uW Standby Power", *Proc. IEEE 1989 Custom Integrated Circuits Conference*, May 16, 1989, pp. 5.1.1-5.1.4.

Ronald W. Swartz et al., "A 15 ns 2500 Gate Highly Flexible CHMOS EPLD", *Proc. IEEE 1989 Custom Integrated Circuits Conference*, May 16, 1989, pp. 5.7.1-5.7.3.

Primary Examiner—David Hudspeth
Attorney, Agent, or Firm—Thomas Schneck

[57] ABSTRACT

A configuration control circuit in an integrated circuit device, such as a programmable logic device, having a programmable memory for storing configuration bits and one or more shift registers which are loadable from the memory. The memory is an array of nonvolatile memory cells that can be user programmed with data corresponding to a desired device architecture. The shift registers are loaded with this data upon power up or a reset. The registers in combination with other circuit gates control the operation of the device such that a particular architecture is implemented. The various configurations can be tested without altering the contents of the memory by loading the shift register externally.

17 Claims, 4 Drawing Sheets

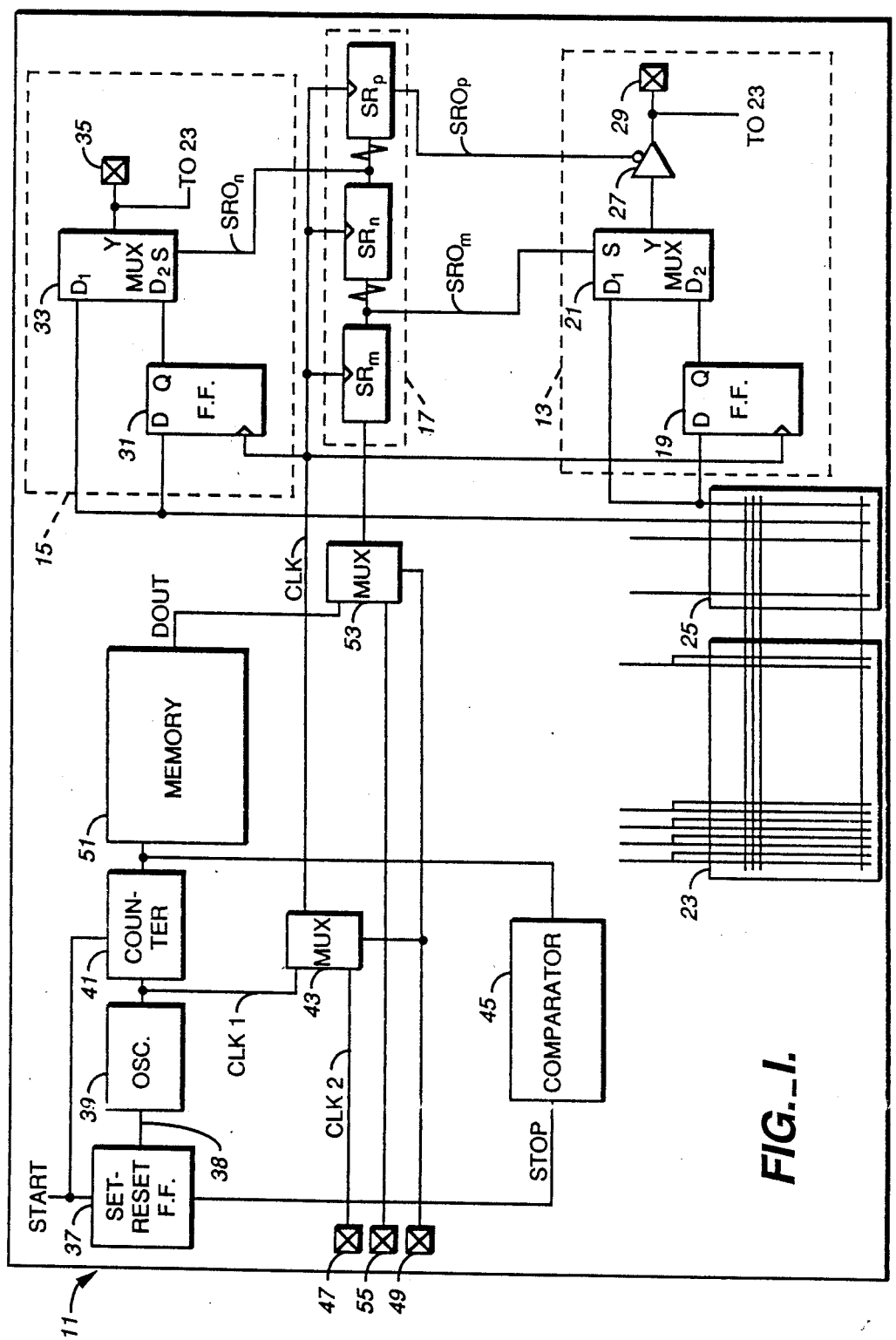
FIG._1.

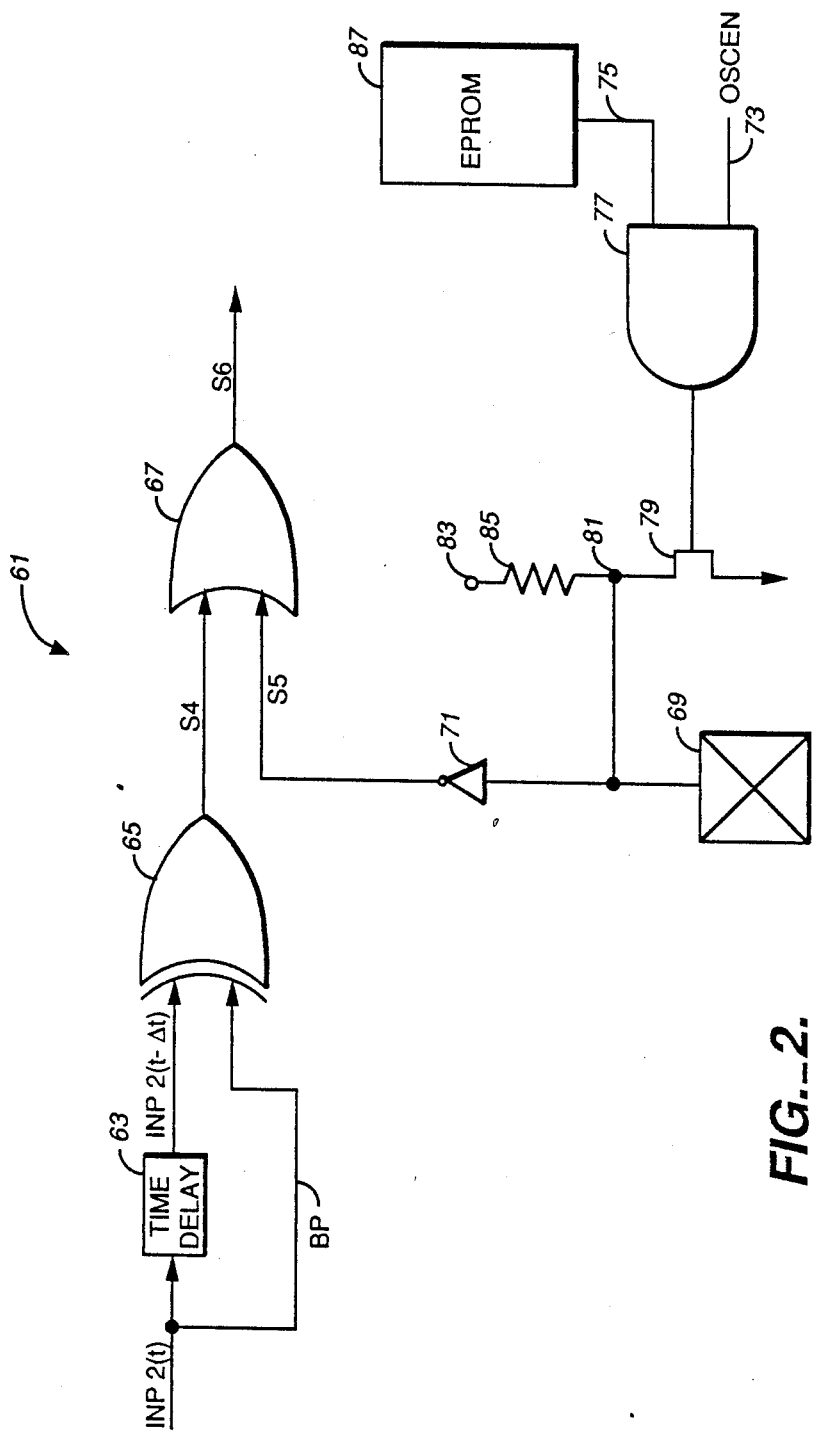
FIG._2.

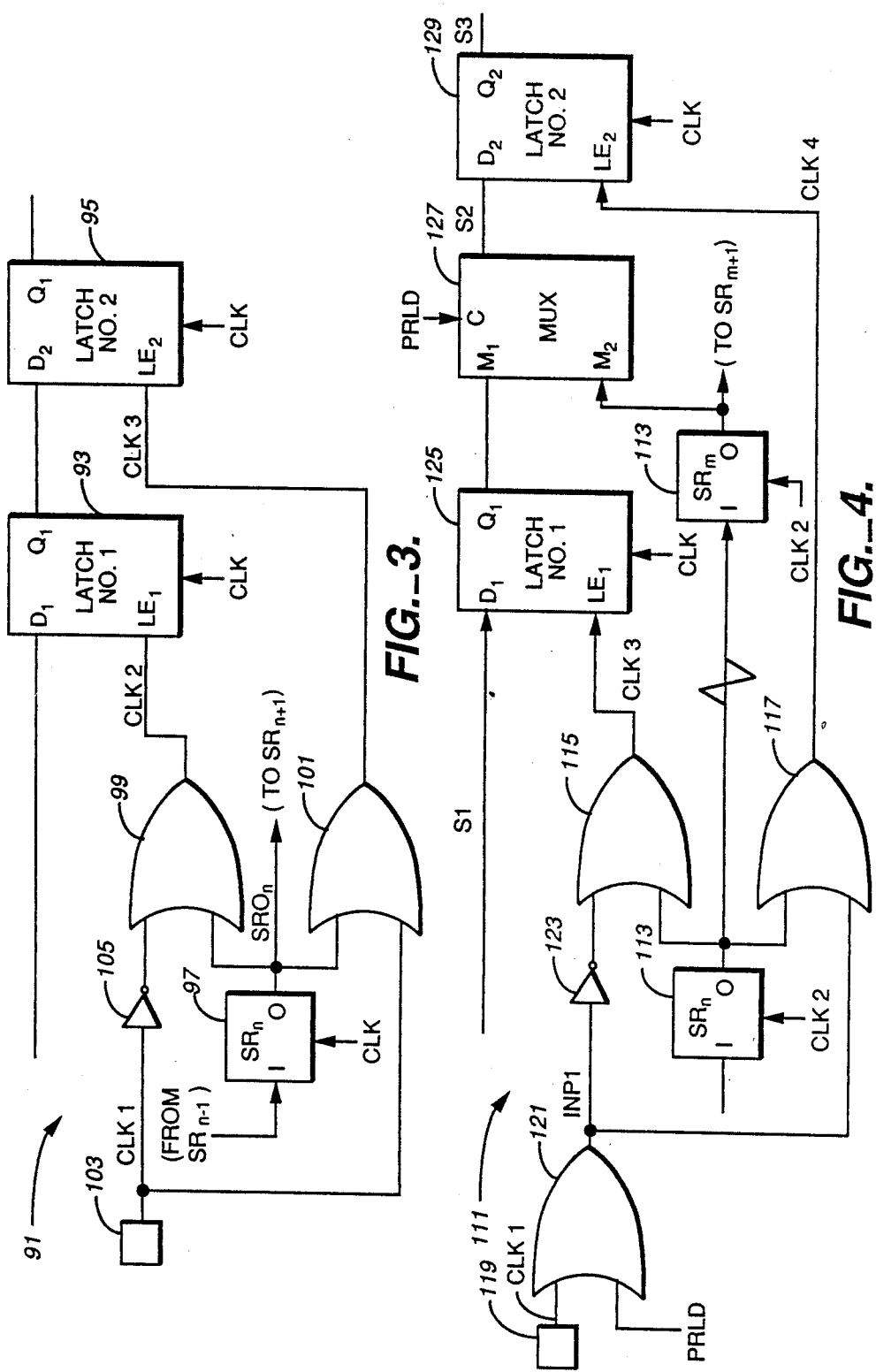
FIG._3.
FIG._4.

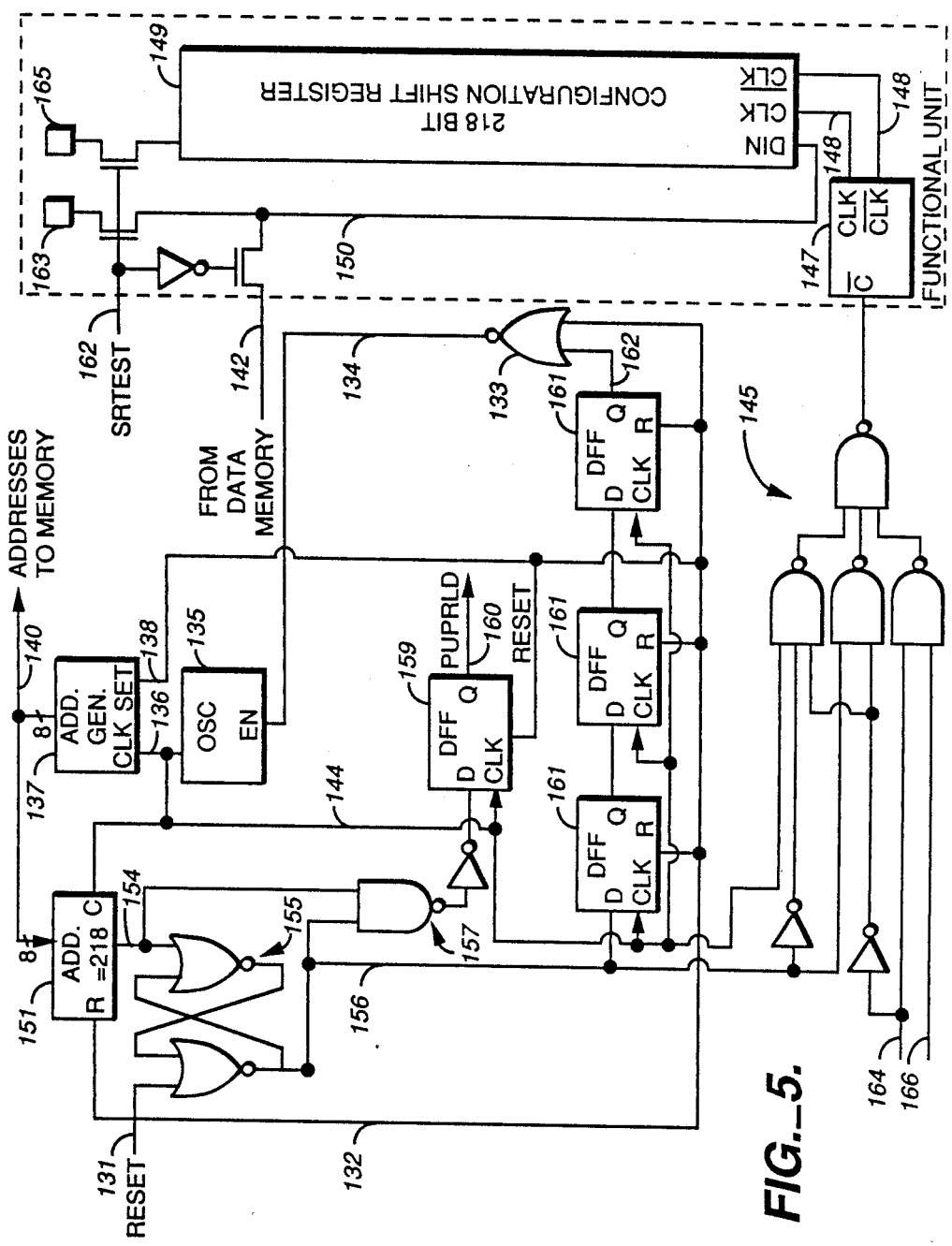
FIG._5.

CONFIGURATION CONTROL CIRCUIT FOR PROGRAMMABLE LOGIC DEVICES

TECHNICAL FIELD

The present invention relates to programmable logic devices (PLDs) and other integrated circuit devices (ICs) which permit a user to configure the architecture of such devices so as to select one or more available device features or options, and in particular to the programmable configuration control circuitry in PLDs and other ICs which enables such architecture configuration to be made.

BACKGROUND ART

In the use of integrated circuit devices (ICs) it is often desirable that the devices be programmable so that their operation may be tailored to fit particular applications. Furthermore, it is desirable that a menu of available features be provided from which an end user of an IC device can choose to best suit his particular application. For example, in a programmable logic device (PLD), available options might include the configuration of one or more pins as input or output pins, the configuration of one or more output macrocells for registered or combinatorial output or buried feedback, the setting of various other logic connections, and the setting of an initial device state. The menu of available options will, of course, be different for each kind of device.

Selection of items from a menu, hereafter referred to as "configuring the architecture" of the device, can be implemented using one of several methods than are known in the art. Three commonly used methods are (1) to provide mask options, (2) to provide "mode" or "control" registers (storage elements) loaded from external circuitry, where the registers' outputs act as architecture controls and (3) to use EPROM or EEPROM transistor elements as described by Hartman et al. in U.S. Pat. No. 4,713,792. However, each of these methods has associated disadvantages.

The first method referred to, i.e., wherein masks used to manufacture the IC are programmed, has the drawback that the configuration of the IC must be implemented during the manufacturing process. Typically, such programming is accomplished during the metal masking step in the production of the IC. The disadvantage of this approach is that configuration selections must be made prior to completion of the manufacturing operation, thereby causing long lead times and many production and inventory problems associated with manufacturing, testing and inventorying the custom IC devices. In addition, if changes are later required, all previous inventory that has matured beyond the point in manufacturing where customization takes place will be obsolete.

The second method, i.e., the use of mode registers, solves the lead time, manufacturing and inventory problems in that the IC parts can be configured by the user after manufacture is completed. In other words, if changes are required, the IC device can be reprogrammed by writing new values into the mode register. The disadvantage of this approach is that register data is lost whenever power is removed from the system. As a consequence, applications of devices having such features are limited.

The third method, i.e., the use of EPROM and EEPROM transistor elements, has several drawbacks. The sense circuit that is needed to read the programmed or unprogrammed state of the EPROMs or EEPROMs dissipates power constantly. The sense and programming circuitry consists of many transistors and is therefore relatively expensive to implement. Third, it is time consuming, and thus expensive, for a manufacturer to test a device before delivery, because a complete test requires that the various possible pathways be enabled by the EPROMs or EEPROMs and tested. The EPROMs or EEPROMs must then be erased and reprogrammed to test other parts of the circuitry.

It is, accordingly, an object of the present invention to provide programmable configuration control circuitry for incorporation in PLDs and other IC devices which permits a user to custom-tailor the circuit architecture of an IC device, while allowing the various subcircuits of the IC device to be tested without having to repeatedly reprogram the device.

It is another object of the invention to provide PLDs having such programmable control circuitry for configuring a PLD's macrocells and the like, while facilitating complete testing.

DISCLOSURE OF THE INVENTION

The above objects have been met with a programmable configuration control circuit for an IC device which has a nonvolatile on-chip configuration memory and one or more shift registers which can be loaded by the configuration memory on power up or on a reset pulse. The shift registers can also be loaded externally with test bits in order to test various circuit pathways on the chip without having to reprogram the IC's configuration memory. Data which have been loaded into the shift registers are transferred to macrocells or other configuration registers which actually control the IC architecture configuration.

Briefly, in an IC device, such as a PLD, having selectable architecture configurations, the configuration control circuit of the present invention includes a programmable memory on the IC device, one or more shift registers, and control means, such as logic gates, for causing the IC device to operate in the selected architecture configuration. The programmable memory is a memory, such as an EPROM or EEPROM memory, having an addressable array of nonvolatile memory cells storing configuration bits. The shift registers are in data communication with the memory so as to be loadable, on power up or a reset pulse, with the configuration bits. The shift registers can also be loaded with test configuration bits from outside the IC device so that a manufacturer or user can test the operation of the device in the various possible configurations. In a PLD having an AND array, an array of OR gates and a macrocell, at least the macrocell would be configurable.

The invention provides apparatus for selective architecture control and facilitates testing of programmable logic devices. The invention allows a user to customize the circuit architecture of the IC device by setting bits in a memory array, where these bits are then placed into a shift register for subsequent architecture control; this allows the IC device to be tested without reprogramming the memory array bits. The memory provides a programmable macrocell in which a shift register, loaded from on-chip memory, is used to control the programming of a selected architecture configuration.

BRIEF DESCRIPTION OF THE DRAWINGS

FIG. 1 is a schematic view of an integrated circuit device having architecture control circuitry of the present invention.

FIG. 2 is a schematic view of a circuit which provides a reset signal at power up and other selected times during operation of an integrated circuit device.

FIG. 3 is a schematic view of a first embodiment illustrating use of the invention for selecting a registered or nonregistered configuration.

FIG. 4 is a schematic view of a second embodiment, illustrating use of the invention that allows a latch or flip-flop to be preloaded at a particular time point such as power up or reset of an integrated circuit device having such a latch or flip-flop.

FIG. 5 is a schematic view of a circuit which provides for the loading of shift registers with configuration bits upon receiving a reset pulse or test signal.

BEST MODE FOR CARRYING OUT THE INVENTION

With reference to FIG. 1, the present invention is a configuration control circuit for programmable logic devices (PLDs) and other integrated circuit (IC) devices which have a number of selectable architecture configurations. A typical PLD in accord with the invention would have a plurality of input and output pins, and at least one functional unit connected to the pins. A functional unit includes a programmable AND array connected to input pins, an array of OR gates connected to the AND array, and a macrocell connected to the array of OR gates and to output pins. A macrocell would typically be configurable to provide options such as registered or nonregistered outputs, feedback to the AND array, a preloaded initial state for its registers, and so forth. While the architecture configuration control circuit to be described below refers principally to configuring macrocells of PLDs, it will be understood that the array of OR gates, input/output pins, interconnections between functional units and the like could also be configured with this circuit. Further, other IC devices which have configurable features can also be configured using the present invention.

In FIG. 1, a PLD 11 includes a first macrocell 13 and a second macrocell 15 operated in parallel and fed and controlled by a shift register 17 and driven by a clock pulse train CLK. The first macrocell 13 may include a D-type flip-flop 19 whose output signal is fed to one input terminal of a multiplexer 21 whose output signal is controlled by the output signal SROm of a bit position SRm of the shift register 17. A second input terminal of the multiplexer 21 and the input terminal of the D flip-flop 19 receive a data signal generated by an AND gate array 23 and OR gate array 25 that are connected in a well known manner. AND gate array 23 and OR gate array 25 together constitute a logic unit which issues data signals that are received by flip-flops 19 and 31 and multiplexers 21 and 33. Thus, the signal issued at the output terminal of the multiplexer 21 may be either a registered signal, which is delayed by one or more clock cycles, or a non-registered signal. The output signal of the multiplexer 21 is received by a tri-state inverter 27, which is optional here, and passed to an output pad 29 for subsequent use. The tri-state inverter 27 is controlled by receipt of an output signal SROp from a second bit position SRp of the shift register 17.

A second D flip-flop 31 also receives a data input signal from the AND gate array 23 and the OR gate array 25; and the output signal of the D flip-flop 31 is fed to an input terminal of a multiplexer 33 whose output signal is controlled by receipt of the output signal SROn of a third bit position SRn of the shift register 17. The multiplexer 33 has a second input terminal that receives a data input signal from the AND gate array 23 and the OR gate array 25. The output of the second controllable flip-flop 33 is passed to a second output pad 35. The output signals of the multiplexer 21 and 33 may also be fed back to AND gate array 23 or sent elsewhere for further processing.

Operation of the apparatus may be initiated by receipt of a start signal at a Set-Reset flip-flop 37, which generates a Set signal 38 to enable an oscillator 39. The output of the oscillator 39 is a clock pulse train CLK1 and fed to a counter 41 and to a first multiplexer 43. The counter 41 is enabled by receipt of the Start signal and begins to count toward a predetermined count number C, and the counter output signal is received by a comparator 45 that will issue an output signal that disables the oscillator 39 when the count number C is reached or exceeded. A clock pulse train source 47 produces a second clock pulse train CLK2 that is fed to a second input terminal of the MUX 43, and a control signal from a multiplexer control signal source 49 determines which of the two clock pulse trains, CLK1 or CLK2, is issued by the MUX 43 as its output signal; this output signal becomes the clock pulse train CLK that drives the shift register 17 and the two macrocells 13 and 15.

The output signal of the counter 41 is received by and drives a memory 51; and the memory 51 issues an output signal, a stream of configuration bits for the shift register 17, that is received by a first input terminal of a second multiplexer 53. The second input terminal of the MUX 53 may be connected to an external source 55 of configuration bits, and the output signal of the MUX is controlled by receipt of the control signal from the multiplexer control signal source 49, or by another similar control signal source. The multiplexers 43 and 53 thus issue the internally-generated configuration bit stream from the memory 51 at time intervals controlled by the internal clock pulse train CLK1; or the multiplexers 43 and 53 issue an externally-generated configuration bit stream at time intervals controlled by the external clock pulse train CLK2.

FIG. 1 illustrates several control features that may be used to control the output signals generated at the pads 29 and 35: (1) the configuration bits at bit positions SRm and SRn at the shift register 17 that control the programmable flip-flops 19 and 31; (2) the configuration bit at bit position SRp of the shift register 17 that controls the tri-state inverter 29; (3) the MUX 43 that controls which clock pulse train, CLK1 or CLK2, drives the shift register 17 and the macrocells 13 and 15; (4) the MUX 53 that controls whether the configuration bit stream from the memory 51 or from the external source 55 is fed to the shift register 17; (5) the sequence of configuration bits made available from the memory 51 and from the external source 55; and (6) the input data for the macrocells 13 and 15 that are made available from the AND gate array 23 and OR gate array 25.

FIG. 2 illustrates an embodiment of the invention that allows a reset signal or other control signal to be generated, for subsequent control purposes, for a predetermined time interval. The apparatus includes a time delay module 63 that receives an input signal INP2(t) at its input terminal as a function of time and issues an output signal INP2(t−$t_d$) at its output terminal, incorporating a time delay of $t_d$. The time delay $t_d$ need not be accurately determined as long as this delay lies in the range of, say, 2–20 nsec. Thus, the time delay module 63 may be an analog module or a digital module. The input signal INP2(t) is also routed around the time delay module by a bypass path BP, and the two signals INP2(t) and INP2(t−$t_d$) are fed to the two input terminals of an XOR gate 65. The XOR gate 65 issues an output signal S4=INP2(t)+INP2(t−$t_d$) that is received by one of two input terminals of an OR gate 67, whose other input terminal receives an as-yet-unspecified input signal S5. The OR gate 67 issues an output signal S6=S4+S5; and if S5=0 then S6 (=S4) will make a transition from logical 0 to logical 1 during a time interval of length t>$t_d$ because the two input signals for the XOR gate will differ during at least a portion of the time interval of length t. Thus, for example, the output signal S4 may make a transition from 0 to 1 during a start-up interval. The duration of this signal S4 should be sufficient to set the flip-flop 37, shown in FIG. 1, and thus initiate the loading of the shift register 17 in FIG. 1. Setting flip-flop 37 will cause its output 38 to remain 1 while the shift register 17 is being loaded.

If the output signal S4 is a logical 0 at any time and the input signal S5 makes a transition from 0 to 1, the output signal S6 will also make a transition from 0 to 1 at that time. The S5 transition will occur when a Start Reset signal, which is a logical zero, is received at a pad 69 and passed through an inverter 71 to the input line that feeds S5 to the OR gate 67.

When the Oscillator Enable signal OSCEN, which corresponds to signal 38 in FIG. 1, is at logical one and received on a first input line 73 to a two-input AND gate 77, and if the other input line 75 is already at logical one, receipt of the Oscillator Enable signal will cause the output signal of the AND gate 77 to become logical one. This will open the gate of a pass transistor 79 whose gate receives the AND gate output signal and cause the voltage at an adjacent node 81 to drop to zero, which will again cause the input signal S5 to make a transition from 0 to 1. If the loading of the shift register is still active, this will not result in any further action, as the flip-flop 37, in FIG. 1, will still be set. The pad 69 will then be driven from within the IC device and the device will thus assert a signal indicating that it is in the reset state. If the gate of the pass transistor 79 is not activated and the input pad 69 does not have a low voltage thereat, a positive voltage source 83 that is connected to the node 81 across a voltage pull-up resistor will maintain the node 81 at a high voltage.

Another control feature is available. The input signal received on input line 75 by the AND gate 77 may be used to enable or suppress the transition in the signal S5 caused by receipt of an Oscillator Enable signal at the gate 77. Thus suppression may be accomplished by provision of an EPROM module 87 that issues the signal received by the AND gate 77 on the input line 75; if the EPROM signal is 1 or 0, the effect of receipt of the Oscillator Enable signal on the output on pad 69 is enabled or suppressed, respectively.

FIG. 3 illustrates an example of using a shift register to render a latch or flip-flop either operable or transparent, thereby configuring a macrocell containing such a latch or flip-flop to output either registered or nonregistered signals. The apparatus 91 includes at least a first latch 93 and a second latch 95, each having a data input terminal D, a latch enable terminal LE that receives a clocking signal, and an output terminal Q. The output terminal of the latch 93 is connected to the data input terminal of the latch 95, and the latches 93 and 95 receive clocking signals CLK2 and CLK3 at their respective latch enable terminals. A shift register 97 is provided, with a selected bit position SRn having an input terminal I, a clock input terminal to receive a clock signal CLK, and an output terminal O that produces an output signal SROn as shown. Each bit position SRk (k=0, 1, 2, ..., and n−1, n, n+1, ...) of the shift register 97 is driven by the same clock signal CLK, but interest centers here on the particular bit position SRn. The output signal that issues from the output terminal of the shift register bit position SRn is passed to an input terminal of each of two two-input OR gates 99 and 101. A clock source 103 provides a clock signal CLK1 that is a series of periodic pulses in a manner well known in the art. The clock signal CLK1 is passed through an inverter 105, and the output signal thereof is passed to a second input terminal of the OR gate 99. The output signal from the OR gate 99, CLK2=CLK1+SROn, is fed to the latch enable terminal LE1 of the first latch 93. The clock signal CLK1 is passed without inversion to a second input terminal of the OR gate 91; and the output signal from the OR gate 91, CLK3=CLK1+SROn, is fed to the latch enable terminal LE2 of the second latch 95. Each latch in each Figure herein is driven by a timing source that produces a clock signal CLK that has the same period as, but need not be identical to, the clock signal CLK1.

Operation of the apparatus 91 proceeds as follows. If the shift register 97 contains a logical zero at bit position SRn, the shift register 97 has no effect, and the first and second latches 93 and 95 are alternately enabled and disabled by receipt of the clocking signals CLK2=CLK1* and CLK3=CLK1, respectively. This causes the first latch 93 to issue an output signal that is received and trapped by the second latch 95 because the second latch 95 is disabled at any time the first latch 93 is enabled. During the next portion of the clock pulse CLK1, the first latch 93 is disabled and traps whatever signal last arrived at its data input terminal, and the second latch 95 is enabled so that this latch issues as an output signal the input signal last received from the first latch 93 at the data input terminal. This reproduces the action of a conventional D-type flip-flop. Now assume that a logical 1 resides in the bit position SRn of the shift register 97. In this instance, the output signals CLK2 and CLK3 simultaneously have the logical value 1 so that the first latch 93 and the second latch 95 are enabled simultaneously. Any input signal that arrives at the data input terminal of the first latch 93 is issued substantially simultaneously at the output terminals of the two latches 93 and 95, and the combination of these two latches is transparent. The two latches 93 and 15 behave as a D-type flip-flop, which is rendered transparent by receipt of the appropriate output signal SROn from the bit position SRn.

FIG. 4 illustrates an example of a circuit in which a shift register allows a flip-flop to be preloaded with a selected value. As an example, one might wish to preload a latch or flip-flop with a predetermined value when the PLD is first powered up so that processing can begin immediately. This circuit uses two bit positions SRn and SRm of a shift register, with the output signal from bit position SRn also being received by an input terminal of each of two OR gates 115 and 117. A clock source 119 provides a periodic sequence of clock pulses CLK1 that is received by one input terminal of a two-input OR gate 121, and the output signal of the AND gate 121 is passed through an inverter 123, with the output signal INP1 thereof being passed to a second input terminal of the OR gate 115. The output signal INP1 of the OR gate 121 is passed without inversion to a second input terminal of the OR gate 117. The output signal SROn of the bit position SRn of the shift register 113 is also received by the next consecutive bit position of that shift register. The output signal CLK3 of the OR gate 115 is passed to the latch enable terminal LE1 of a first latch 125 whose data input terminal D1 receives an input signal S1 from some other source (not shown). The output signal at the output terminal Q1 of a first latch 125 is passed to a first data input terminal M1 of a two-input multiplexer 127, whose second input terminal receives the output signal SROm issued by a second bit position SRm of the shift register 113. The output signal S2 that is issued at the output terminal of the multiplexer 127 is passed to the data input terminal D2 of a second latch 129, whose latch enable terminal receives the output signal CLK4 of the OR gate 117. Finally, a control signal PRLD is received at the second input terminal of the AND gate 121 and at the control terminal C of the multiplexer 127. The logical value of the control signal PRLD that is received by the multiplexer 127 determines whether the output signal S2 issued by the multiplexer 127 is the input signal received at input terminal M1 or M2. In the embodiment shown in FIG. 4, with PRLD=0, the output signal S2 from multiplexer 127 will be the input signal received at input terminal M1; if PRLD=1, the output signal S2 is the input signal received at input terminal M2.

Operation of the apparatus 111 shown in FIG. 4 proceeds as follows. The default value for the control signal PRLD is PRLD=0. With this choice for PRLD, the OR gate 121 is transparent and the output signal INP1=CLK1. The output signals from the OR gates 115 and 117 become CLK3=INP1*+SROn and CLK4=INP1+SROn, respectively, where SROn is the output signal issued by the bit position SRn of the shift register 113. With SROn=0, the OR gates 115 and 117 become transparent, and the first and second latches 125 and 129 are alternatingly enabled by receipt of the latch enable signals CLK3=CLK1* and CLK4=CLK1, respectively. In this mode, with PRLD=0, the output signal S2 from the multiplexer 127 becomes the output signal issued by the first latch 125; and the latch,multiplexer,latch combination 125,127,129 operates as a conventional D-type flip-flop. With the control signal PRLD=1 or the output signal SROn=1, the latch,multiplexer,latch combination 125,127,129 does not behave as a conventional D-type flip-flop.

Where the output signal SROn=1 and as indicated above in the discussion of FIG. 1, the latch enable terminals LE1 and LE2 of the first and second latches 125 and 129, respectively, simultaneously receive a latch enable signal so that the two latches are simultaneously enabled and the combination 125,127,129 becomes transparent. In this instance, the input signal S1, the intermediate output signal S2 and the final output signal S3 are all equal and appear substantially simultaneously. In this mode of operation, the apparatus 111 becomes a transparent latch.

Now assume that the control signal PRLD=1 and the output signal SROn of the bit position SRn of shift register 113 has the logical value 0. In this mode, the output signals from the OR gates 115 and 117 become CLK3 =(PRLD+CLK1)*=1 and CLK4=PRLD=1, respectively; and the output signal S2 from the multiplexer 127 is the output signal SROm from shift register bit position m received at the input terminal M2 of the multiplexer 127. In this mode, the first latch 125 may be enabled and the second latch 129 is always enabled so that any signal S2 arriving at the data input terminal of the latch 129 is permanently trapped thereat, irrespective of the current clock phase CLK1.

In a fourth mode of operation of the apparatus 111 shown in FIG. 4, PRLD=1 and SROn=1. In this mode the output signals from the two OR gates 115 and 117 become CLK3=(PRLD+CLK1)*+SROn=1 and CLK4=(PRLD CLK1)+SROn=1, respectively, so that the two latches 125 and 129 are simultaneously enabled and the combination thereof becomes transparent. However, the output signal 53 issued at the output terminal Q2 of the second latch 129 is, in this instance, S3=SROm rather than S3 =S1. Operating in this mode, the flip-flop represented by the latch,multiplexer,latch combination 125,127,129 is preloaded with a predetermined value, namely the output signal SROm from bit position m of the shift register 113, and this flip-flop becomes transparent.

In the embodiment shown in FIG. 4, the signals PRLD and SROn serve as control signals and the signal SROm serves as a data bit that can be "preloaded" into the flip-flop that comprises the latches 125 and 129 and the multiplexer 127, for issue at a chosen time point. The defining equations for the embodiment of the invention shown in FIG. 4 are $$CLK3 = (PRLD + CLK1)^* + SROn,$$

$$CLK4 = (PRLD + CLK1) + SROn,$$

$$S2 = PRLD^* \cdot S1 \cdot (CLK3) + PRLD \cdot SROm,$$

$$S3 = S2 \cdot (CLK4),$$

where the symbols (CLK3) and (CLK4) indicate that the appended output signals appear only when CLK3=1 or CLK4=1, as the case may be; that is, only when the first latch 125 or the second latch 129 is enabled, as the case may be.

With reference to FIG. 5, the configuration control circuit of the present invention contains a power-on reset circuit, such as that seen in FIG. 2, which generates a reset signal RESET whenever any of the following conditions occurs: (1) the chip is initially powered up, i.e. the supply voltage goes from 0V to 4.5V; (2) a glitch on the supply line pulls the supply voltage below a 3.0V threshold level for a significant time period, such as 5 ns; and (3) an external reset signal is applied to the chip, such as through pad 69 in FIG. 2. The duration of the reset signal pulse (active high) is typically about 500 ns. The configuration control circuit of the present invention also contains a shift register load circuit, such as that seen in FIG. 5, for loading configuration bits from memory 51, in FIG. 1, into the shift registers.

The load circuit in FIG. 5 receives the reset pulse RESET on an input line 131 connected to output 56 in FIG. 2. When RESET is high, the configuration load circuit is initialized. Input line 131 connects, for example, to circuit elements such as address comparator 151, latch 155, and along reset line 132 to address generator 137 and flip-flops 159 and 161. Reset line 132 also connects to NOR gate 133. When the reset pulse RESET returns low, the output OSCEN on enable line 134 from NOR gate 133 goes high. This enables a clock source or oscillator 135 connected to enable line 134. Oscillator 135 begins to generate a clock signal OSCOUT on clock lines 136 and 144. Typically, oscillator 135 generates a clock signal with a frequency of about 1 MHz.

An address generator 137 has a clock input connected to clock line 136 and a set input connected to reset line 132 via line 138. The address generator 137 is set to an initial address by the reset pulse RESET, and then generates a sequence of memory addresses in time with clock signal OSCOUT on clock line 136. The addresses, typically made up of eight bits A0–A7, are transferred on bus 140 to the programmable configuration memory on the IC device, such as memory 51 in FIG. 1, which causes configuration bits stored in the memory to be transferred to a configuration shift register 149. Data from the memory is received by the shift register 149 from the data lines 142 and 150. The clock signal OSCOUT from oscillator 135 is transferred along clock line 144 to NAND gates 145 and then to a clock generator circuit 147 which provides the clock signals SRCLK and SRCLKB for the shift register 149. So, the access time of the programmable memory 51 in FIG. 1 should be faster than one half clock cycle, or about 500 ns.

In this manner, the addresses are stepped through one at a time and the configuration bits are loaded into the shift registers. An address comparator 151 receives address bits on bus 152. Comparator 151 compares the address output from generator 137 with a predetermined stop address, such as 218, corresponding to the number of shift register bits. When the stop address is reached, comparator 151 outputs a stop signal CNT218 on stop line 154, which sets a latch 155 whose output is a disable signal LDDONE. Disable signal LDDONE, carried on clock disable line 156, is transferred to NAND gates 145 disabling the clock generator circuit 147 of shift register 149. This stops the loading of shift register 149. Signal LDDONE may also be carried to NAND and inverter gates 157 and flip-flop 159 where a power-up preload signal PUPRLD is generated. Preload signal PUPRLD causes initial data bits to be preloaded from shift register 149 into macrocell registers 125 and 129 in FIG. 4. The preloading lasts one clock cycle. On the next clock edge after preload signal PUPRLD has gone away, a stop signal STOP is generated by flip-flop 161, which through NOR gate 133 disables the oscillator 135. The loading process is complete and the chip is ready for use. Typically, the entire loading process will take less than 250 microsecond.

Shift register 149 can also be loaded with test configuration bits from outside the PLD. A test enable signal SRTEST is input on line 164 into NAND gates 145. This disconnects the clock signal OSCOUT from oscillator 135 and the disable signal LDDONE from the clock generator circuit 147, while connecting a test clock signal SRCLKIN to the clock generator circuit 147. Test enable signal SRTEST also connects external input and output pins 163 and 165 to the shift register 149, while disconnecting the configuration memory line 142 from shift register 149. Thus, when in this test mode, each register input, clock and output is accessible to the user. This allows new configurations to be loaded and tested without having to reprogram the configuration memory 51 in FIG. 1.

We claim:

1. In an integrated circuit device having selectable architecture configurations, a configuration control circuit comprising,
   a programmable memory on the integrated circuit device having an addressable array of nonvolatile memory cells for storing configuration bits,
   one or more shift registers in data communication with said programmable memory, said shift registers being loadable with said configuration bits, and
   control means responsive to configuration bits loaded into said shift registers for causing said integrated circuit device to operate in a selected architecture configuration corresponding to said configuration bits.

2. The circuit of claim 1 wherein said programmable memory is selected from the group consisting of mask programmable ROM, fuse programmable ROM, EPROM and EEPROM memories.

3. The circuit of claim 2 wherein said shift registers are loadable with said configuration bits on device power up and reset.

4. The circuit of claim 2 further comprising means responsive to a reset pulse and communicating with said programmable memory for addressing said memory cells and causing said configuration bits to be loaded into said shift registers whenever a reset pulse is received.

5. The circuit of claim 2 wherein said control means includes logic gates having outputs connected to configurable portions of said integrated circuit device, each of said logic gates having at least one input connected to a shift register so as to receive a configuration bit.

6. The circuit of claim 2 wherein said integrated circuit device is a programmable logic device having at least one configurable functional unit, a functional unit including a programmable AND array, an array of OR gates, connected to said AND array, and a macrocell connected to said array of OR gates, said control means connected to at least said macrocell for causing said macrocell to operate in a selected architecture configuration corresponding to said configuration bits.

7. The circuit of claim 2 wherein said shift registers are also loadable from outside of said integrated circuit device with test configuration bits, whereby a user can test the operation of said integrated circuit devices in any selected architecture configuration.

8. A programmable logic device comprising,
   a plurality of input and output pins,
   at least one functional unit connected to said pins, a functional unit including an AND array connected to said input pins, an array of OR gates connected to said AND array, and a macrocell connected to said array of OR gates, said macrocell also connected to said output pins,
   a programmable memory on the programmable logic device having an addressable array of nonvolatile memory cells for storing configuration bits,
   at least one shift register for each functional unit in data communication with said programmable memory, said shift register being loadable with said configuration bits,
   control means responsive to configuration bits loaded into said shift registers for causing said functional unit to operate in a selected architecture configuration corresponding to said configuration bits, said control means connected to at least said macrocell in said functional unit so as to configure said macrocell.

9. The device of claim 8 wherein said shift register is also connected to said pins, whereby said shift register is loadable with test configuration bits from outside of the programmable logic device via said input pins, the device further comprising means for enabling test configuration bits to be loaded into said shift register.

10. The device of claim 8 further comprising, means responsive to a power level condition on said programmable logic device for generating a reset pulse, means enabled by said reset pulse for generating a sequence of clock pulses, an address generator connected to receive said reset pulse and said clock pulses for producing a sequence of memory addresses, an output of said address generator connected to said programmable memory so as to transmit said sequence of memory addresses and thereby address said array of memory cells, said shift register being loaded in response to said sequence of memory addresses, and means for comparing said memory addresses with a predetermined address and for stopping said shift register loading when said predetermined address is detected.

11. The device of claim 10 further comprising means responsive to said reset pulse generating means for selectively outputting at an output pin a signal indicating that a reset is taking place.

12. The device of claim 8 wherein said programmable memory is selected from the group consisting of mask programmable ROM, fuse programmable ROM, EPROM and EEPROM memories.

13. A programmable logic device comprising, a timing source that produces a sequence of periodic timing pulses, a shift register having a data input terminal, having a clock input terminal to directly or indirectly receive timing pulse signals from the timing source and having a first bit position and a second bit position that each have an input terminal to receive a bit input signal and an output terminal to issue a bit output signal, a logic unit having at least two output terminals to issue first and second data signals thereat;

a first programmable flip-flop apparatus, having a clock input terminal to directly or indirectly receive timing pulse signals from the timing source, having a data input terminal to receive the first data signal thereat, having a control input terminal connected to the output terminal of the first bit position to receive a first control signal thereat, and having an output terminal to issue a first flip-flop output signal that is either the data input signal received at the most recent clock pulse or the data input signal received at the immediately preceding clock pulse, according as the first control signal received has a first predetermined value or a second predetermined value respectively, a second programmable flip-flop apparatus, having a clock input terminal to directly or indirectly receive timing pulse signals from the timing source, having a data input terminal to receive the second data signal thereat, having a control input terminal connected to the output terminal of the second bit position to receive a second control signal thereat, and having a data output terminal to issue a second flip-flop output signal that is either the data input signal received at the most recent clock pulse or the data input signal received at the immediately preceding clock pulse, according as the second control signal has a third predetermined value or has a fourth predetermined value, respectively, and a memory array having storage locations for a sequence of bit values, having a clock input terminal to receive timing pulses from the timing source, and having a memory output terminal that is directly or indirectly connected to the input terminal of the shift register to provide the shift register with a sequence of shift register bit values to be sequentially loaded into the bit positions of the shift register.

14. The device of claim 13, wherein said shift register has a third bit position that has an input terminal to receive a bit input signal and an output terminal to issue a bit output signal, and further comprising, a tri-state inverter having an input terminal that is connected to data output terminal of the first programmable flip-flop apparatus, having an inverter control input terminal that is connected to the output terminal of the third bit position, and having an output terminal that issues the input signal received at its input terminal, the logical complement of this input signal, or no signal, according to the signal received at the inverter control input terminal.

15. The device of claim 13, further comprising, a second timing source that produces a second sequence of periodic timing pulses, a shift register data source that produces a second sequence of shift register bit values, a first multiplexer that has a first data input terminal connected to said first timing source, having a second data input terminal connected to the second timing source, having a control input terminal to receive a third control input signal thereat, and having a data output terminal that issues the timing pulse signal received from said first timing source or from the second timing source according to the third control signal received, where the multiplexer data output terminal is connected to the clock input terminals of the first programmable flip-flop apparatus, the second programmable flip-flop apparatus and the shift register, a second multiplexer having a first data input terminal connected to the output terminal of said memory array, having a second data input terminal connected to the shift register data source, having a control input terminal to receive the third control signal thereat, and having a data output terminal that issues the shift register bit sequence received from said memory array or from the shift register data source according to the third control signal received, where the multiplexer data output terminal is connected to the data input terminal of said shift register, and a third control signal source, connected to the control input terminals of the first and second multiplexers, to provide a third control signal.

16. In a logic device that includes first and second signal latches, each having a data input terminal, a latch enable terminal and an output terminal, with the output terminal of the first latch being connected to the data input terminal of the second latch, programmable bypass apparatus that can selectively make the first latch transparent so that any signal that appears at the input terminal of the first latch appears at the output terminal of the second latch at substantially the same time, the apparatus comprising, a timing source that produces a sequence of periodic pulses, a shift register having a sequence of bit positions, with each bit position having an input terminal that receives an input bit signal and an output terminal that issues an output bit signal, first and second substantially identical logic gates, each having two input terminals and an output terminal, with the first input terminal of each logic gate being connected to the output terminal of the same, selected bit position of the shift register, with a second terminal of the first logic gate being connected to the timing source, and a signal inverter having an input terminal connected to the timing source and having an output terminal connected to the second input terminal of the second logic gate, where the output terminals of the first and second logic gates are connected to the latch enable terminals of the second and first latches, respectively, so that, when the output terminal of the selected bit position issues a relatively high voltage signal, the first and second latches are enabled and the next signal received at the data input terminal of the first latch is issued substantially simultaneously at the output terminal of the second latch.

17. Programmable flip-flop apparatus that can behave as a conventional D-type flip-flop, as a preloaded flip-flop or as a transparent flip-flop, the apparatus comprising, first and second signal latches, each having a data input terminal, a latch enable terminal and an output terminal, with the input terminal of the first latch receiving an input signal for the apparatus and the output terminal of the second latch issuing an output signal for the apparatus, a timing source that produces a sequence of periodic pulses, a control signal source that produces a control signal, a shift register having at least first and second bit positions that each have an input terminal to receive a bit input signal and an output terminal to issue a bit output signal, a multiplexer having first and second data input terminals, a control input terminal and an output terminal, with the first data input terminal being connected to the output terminal of the first latch, the second input terminal being connected to the output terminal of the shift register second bit position, the control input terminal being connected to the control signal source, and the output terminal being connected to the input terminal of the second latch, a first two-input logic gate having an output terminal, with first and second input terminals being connected to the timing source and to the control signal source, respectively, second and third substantially identical, two-input logic gates, each having an output terminal, with the first input terminal of each of the second and third logic gates being connected to the output terminal of the first shift register bit position, and with a second input terminal of the second logic gate being connected to the output terminal of the first logic gate, and a signal inverter having an input terminal connected to the output terminal of the first logic gate and having an output terminal connected to the second input terminal of the third logic gate, where the output terminals of the second and third logic gates are connected to the input enable terminals of the second and first latches, respectively.

* * * * *

UNITED STATES PATENT AND TRADEMARK OFFICE
CERTIFICATE OF CORRECTION

PATENT NO. : 4,940,909

DATED : July 10, 1990

INVENTOR(S) : Theodur Mulder et al.

It is certified that error appears in the above-identified patent and that said Letters Patent is hereby corrected as shown below:

Column 1, line 32, "methods than are" should read
-- methods that are --.

Column 6, line 22, "CLK2 = CLK1 + SROn" should read
-- CLK2 = CLK1* + SROn --.

Column 8, line 17, "CLK4 = (PRLD CLK1)" should read
-- CLK4 = (PRLD + CLK1) --.

Claim 17, column 14, line 25, after "each having" insert
-- two input terminals and --.

Signed and Sealed this

Twenty-ninth Day of October, 1991

Attest:

HARRY F. MANBECK, JR.

*Attesting Officer*    *Commissioner of Patents and Trademarks*

UNITED STATES PATENT AND TRADEMARK OFFICE
CERTIFICATE OF CORRECTION

PATENT NO. : 4,940,909

DATED : July 10, 1990

INVENTOR(S) : Theodor Mulder et al.

It is certified that error appears in the above-identified patent and that said Letters Patent is hereby corrected as shown below:

Column 1, line 32, "methods than are" should read
-- methods that are --.

Column 6, line 22, "CLK2 = CLK1 + SROn" should read
-- CLK2 = CLK1* + SROn --.

Column 8, line 17, "CLK4 = (PRLD CLK1)" should read
-- CLK4 = (PRLD + CLK1) --.

Claim 17, column 14, line 25, after "each having" insert
-- two input terminals and --.

This certificate supersedes Certificate of Correction
issued October 19, 1991

Signed and Sealed this

Tenth Day of March, 1992

Attest:

HARRY F. MANBECK, JR.

*Attesting Officer*      *Commissioner of Patents and Trademarks*